United States Patent
Cheng et al.

(10) Patent No.: US 7,736,153 B2
(45) Date of Patent: Jun. 15, 2010

(54) ELECTRICAL CONNECTOR ASSEMBLY HAVING IMPROVED CLIP MECHANISM

(75) Inventors: Chih-Pi Cheng, Tu-Cheng (TW); Chi-Nan Liao, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/485,077

(22) Filed: Jun. 16, 2009

(65) Prior Publication Data
US 2009/0311885 A1 Dec. 17, 2009

(30) Foreign Application Priority Data
Jun. 16, 2008 (TW) .............................. 97210592 U

(51) Int. Cl.
*H01R 12/00* (2006.01)
(52) U.S. Cl. ....................................................... 439/66
(58) Field of Classification Search .................. 439/66, 439/331, 487, 357; 361/719
See application file for complete search history.

(56) References Cited

U.S. PATENT DOCUMENTS

| | | | |
|---|---|---|---|
| 7,435,124 B2 * | 10/2008 | Ma et al. ..................... | 439/331 |
| 7,539,027 B2 * | 5/2009 | Callahan et al. ............. | 361/803 |
| 7,632,128 B2 * | 12/2009 | Lin et al. ..................... | 439/331 |
| 2009/0197454 A1 * | 8/2009 | Liao ............................ | 439/331 |
| 2009/0227135 A1 * | 9/2009 | Liao ............................ | 439/345 |
| 2009/0286428 A1 * | 11/2009 | Wu et al. .................. | 439/752.5 |

FOREIGN PATENT DOCUMENTS

TW         M349083         1/2009

\* cited by examiner

*Primary Examiner*—T C Patel
*Assistant Examiner*—Phuong Nguyen
(74) *Attorney, Agent, or Firm*—Andrew C. Cheng; Wei Te Chung; Ming Chieh Chang

(57) ABSTRACT

An electrical connector assembly for electrically connecting a printed circuit board and an electronic package, comprises an electrical connector on which the electronic package is mounted, a heat sink module mounted upon the electronic package and a clip positioned upon the heat sink module. The printed circuit board defines a connector mounting area surrounded by a plurality of through holes thereof. The clip has a base portion downwardly pressing against the heat sink module, a pair of mounting portions mounted to the corresponding holes, and a pair of pressing portions extending from the mounting portions and disposed on opposite sides of the clip for pressing against the heat sink module.

17 Claims, 11 Drawing Sheets

ELECTRICAL CONNECTOR ASSEMBLY HAVING IMPROVED CLIP MECHANISM

BACKGROUND OF THE INVENTION

1. Field of the Invention

The present invention relates to an electrical connector assembly, and more particularly to an electrical connector assembly with a clip for positioning a heat sink module on an electrical connector in which the clip applies at least three pressing points on the heat sink to ensure a balanced positioning of the heat sink over an IC module.

2. Description of the Prior Art

Electrical connector is typically used for electrically connecting an electronic package and a printed circuit board, generally comprises an insulative housing, a plurality of contacts received in the insulative housing and a fastening device. The fastening device comprises a stiffener, a clip pivotally mounted to one end of the stiffener and a lever pivotally mounted to the other end of the stiffener. The clip is adapted to press the electronic package toward the insulative housing, and the lever is used to lock the clip to the stiffener. However, the lever and the clip need an enough room to be operated, so this type electrical connector can be applied to a desktop computer and is impossible to be applied to a notebook computer.

Electrical connector used in notebook usually uses another type of clip to fasten the electronic package to an insulative housing of the connector. A chip 6' shown in FIG. 1 is a substantially rectangular configuration and has two parallel plate-form springs 61'. When the clip 6' is locked down to the printed circuit board, the spring 61' will apply a downward force toward the package disposed within the insulative housing through a heat sink in contact with the package. Because the spring 61' features an excellent elasticity and it can be easily pushed downward to do the job. Accordingly, if the chip 6' bears an excessive force, a corresponding deformation may occur and once it exceeds its yielding point, a permanent deformation might happen, thereby rendering the clip 61' useless. Hence, we must limit the force that exerts to the chip 6'.

Applicant has applied a Taiwan Pat No. M349083 issued on Jan. 11, 2009 as referring to FIG. 2 to FIG. 4. FIG. 2 and FIG. 3 show the electrical connector assembly connecting an electronic package 3' to a printed circuit board 1'. The electrical connector assembly comprises an insulative housing 2' with a plurality of contacts (not shown) received therein to in contact with the electronic package 3', a supporting body 40' assembled with the heat plate (not labeled), and a pair of clips 44' and heat pipe 43' mounted on the supporting body 40'. Referring to FIG. 3, the clip 40' is attached to the printed circuit board 1' by a plurality of screws 12', and exerts a downward loading force to press the electronic package 3' to securely connect with the contacts (not shown). Referring to FIG. 4, the screws 12' are disposed near the edges of the free ends of the clip 44', so the free ends of the clip 44' will experience deformations as latching forces which are caused by the screws 12' are too large. That may reduce the loading force of the clip 44' and influence the connection between the electronic package 3' and the contacts.

Therefore, it is need to find a new electrical connector assembly to overcome the problems mentioned above.

SUMMARY OF THE INVENTION

Accordingly, an object of the present invention is to provide an electrical connector assembly with a clip for providing an enough balanced force to establish a reliable connect interconnection between an electronic package and a printed circuit board.

In order to achieve the object set forth, a clip adapted to provide a loading force for pressing the electronic package to an insulative housing with contacts, comprises a base portion, a pair of spring portions, a pair of mounting portions and a pair pressing portions. The base portion locates in a horizontal surface for providing a loading force. The pair of spring portions extend upwardly from opposite longitudinal ends of the base portion. The pair of mounting portions extend downwardly from free ends the spring portions. The pair of pressing portions extend upwardly from free ends of the mounting portions for providing another loading force.

In order to further achieve the object set forth, an electrical connector assembly electrically connecting an electronic package and a printed circuit board comprises a printed circuit board, comprises an electrical connector mounted on the printed circuit board and the electronic package mounted upon the connector, a heat sink module mounted upon the electronic package and a clip positioned upon the heat sink module. The clip has a base portion downwardly pressing against the heat sink module, a pair of mounting portions mounted to the printed circuit board, and a pair of pressing portions extending upwardly from the mounting portions to press against the heat sink module.

DESCRIPTION OF PREFERRED EMBODIMENT

Reference will now be made to the drawings to describe the present invention in detail.

Figure 1:
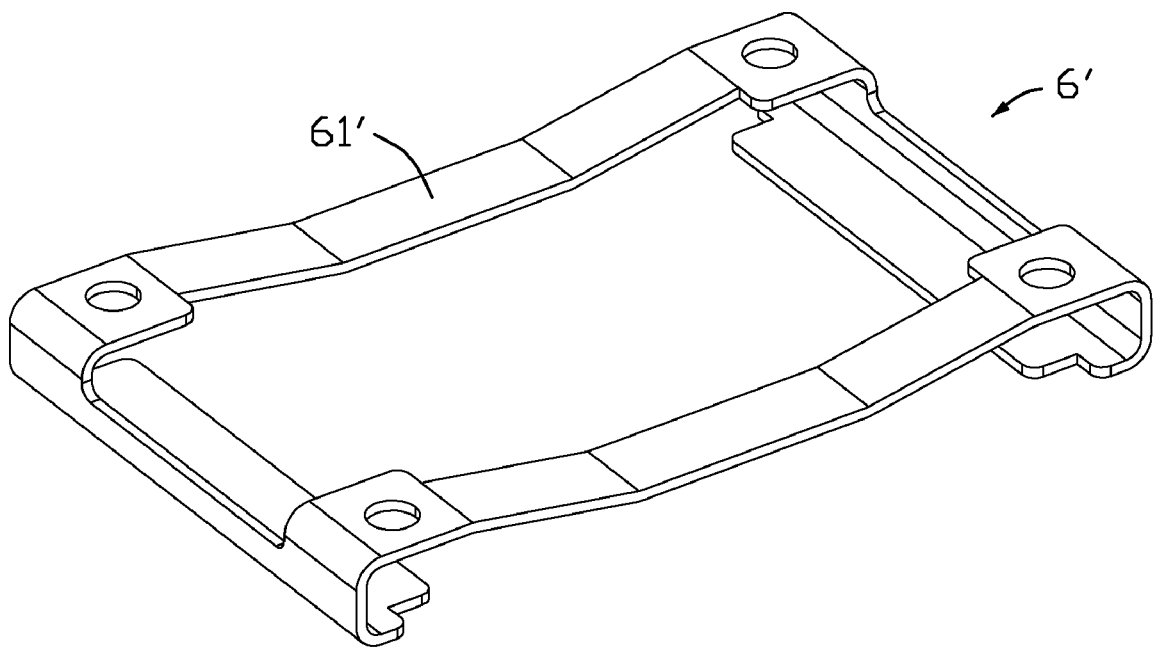
FIG. 1 is a perspective view of a chip of a conventional electrical connector assembly.
Figure 2:
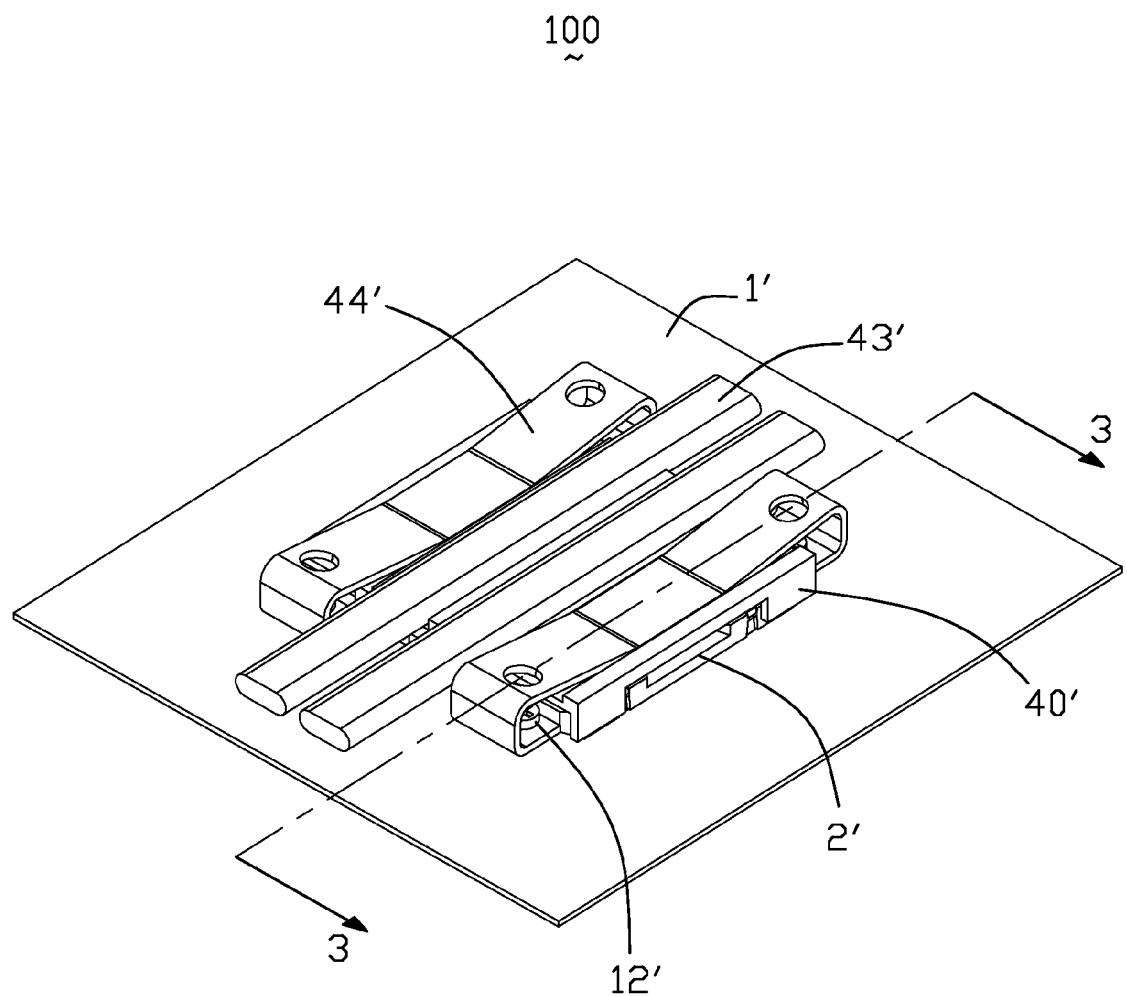
FIG. 2 is an assembled perspective view of a related electrical connector assembly related to the prevent invention.
Figure 3:
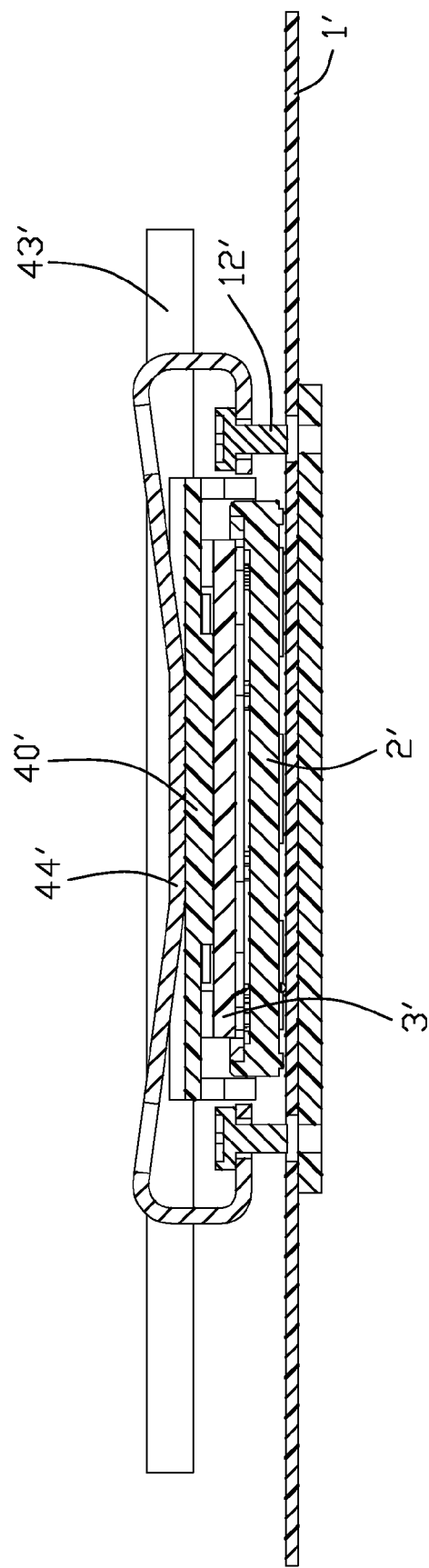
FIG. 3 is a schematic view of the related electrical connector assembly in FIG. 2 taken along line 3-3, showing a chip of the related electrical connector assembly is not latched to the printed circuit board.
Figure 4:
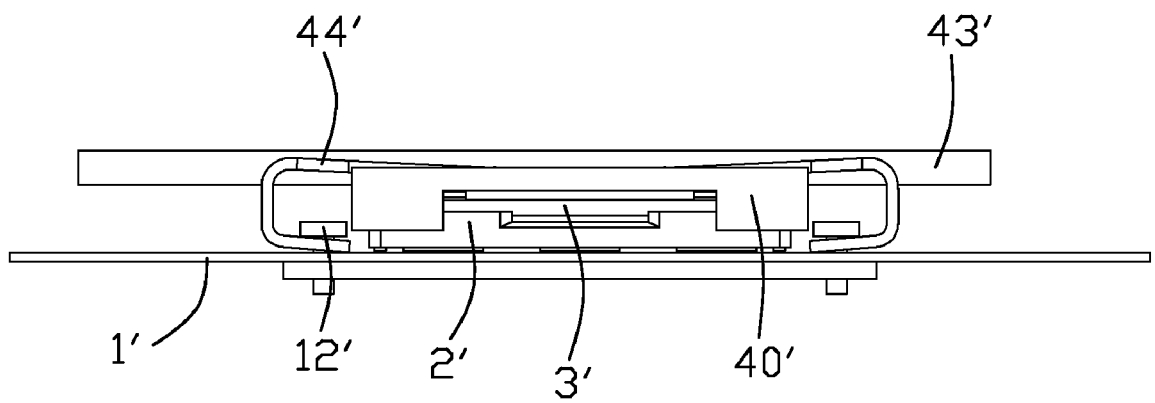
FIG. 4 is a side view of the related electrical connector assembly in FIG. 2, showing the chip is latched to the printed circuit board by screws.
Figure 5:
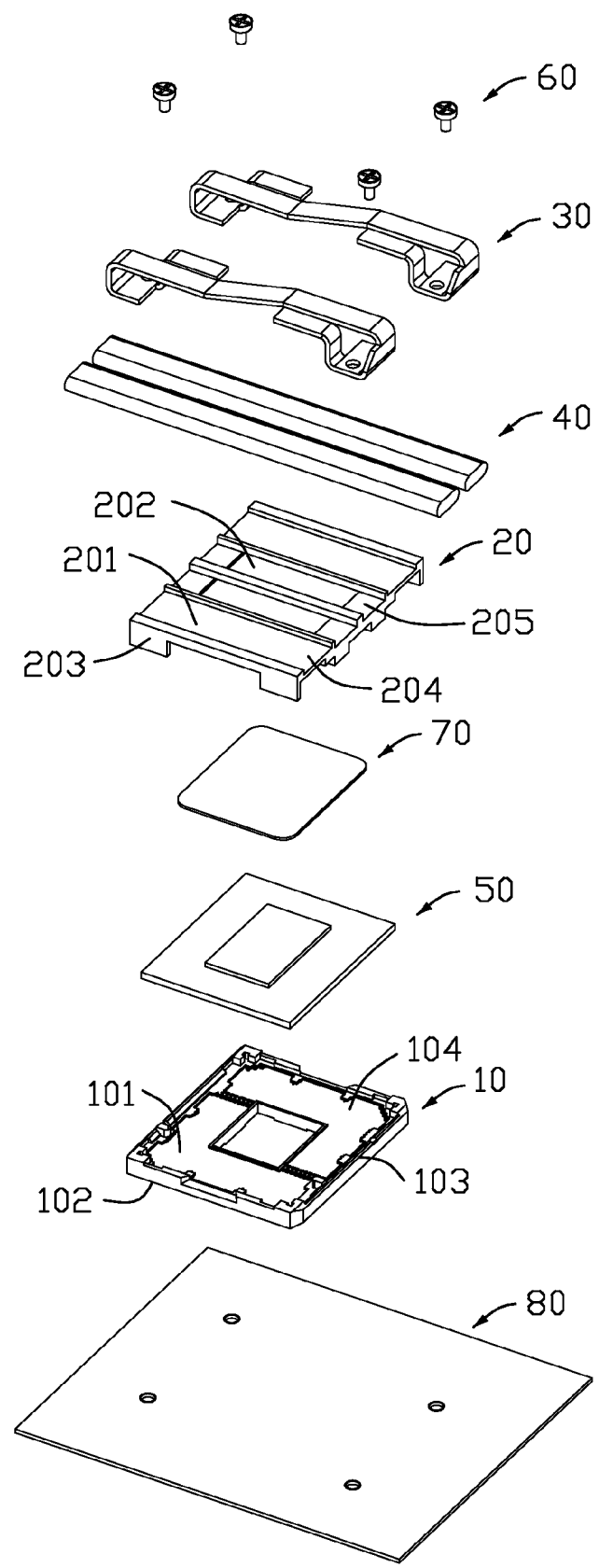
FIG. 5 is an exploded perspective view of an electrical connector assembly according to the present invention.

FIG. 5 shows an electrical connector assembly used for electrically connecting an electronic package 50 to a printed circuit board 80. The electrical connector assembly comprises an electrical connector, a heat sink module mounted upon the electrical connector, and clips 30 exerting a loading force to the electronic package 50. The heat sink module includes a heat plate 70 mounted upon the electronic package 50, a supporting body 20 mounted upon the heat plate 70, and a pair of heat pipes 40 mounted upon the supporting body 20. The clips 30 are mounted upon the supporting body 20 and secured to the printed circuit board 80 by a plurality of connecting members 60. The electrical connector comprises an insulative housing 10 receiving a plurality of contacts (not shown), and the electronic package 50 is mounted within the insulative housing 10. The printed circuit board 8 defines a connector mounting area surrounded by a plurality of through holes 801.

The insulative housing 10 is a substantially rectangular configuration with a mating surface 101 and a mounting surface 102 opposite to the mating surface 101 for mounting to the printed circuit board 80. A plurality of periphery walls 103 extend upward from the mating surface 101 to define a cavity 104 with the mating surface 101. A plurality of passageways (not shown) are defined and extend from the mating surface 101 to the mounting surface 102 for receiving the contacts (not shown).

The supporting body 20 is formed with a rectangular configuration and made of casting. The supporting body 20 comprises a main portion 201. A top surface of the main portion 201 comprises a first and a second pairs of receiving sections 204, 205. The first pair of the receiving sections 204 are spaced from each other in a transversal direction of the supporting body 20 and disposed at opposite ends of the main portion 201. The second pair of the receiving sections 205 are disposed adjacent each other and at a middle of the supporting body 20 in the transversal direction. An opening 202 is defined of the main portion 201 and passes through the second receiving sections 205. Four engaging portions 203 extend downwardly from the opposite ends of the main portion 201 for engaging with outside walls of the insulative housing 10.

Figure 6:
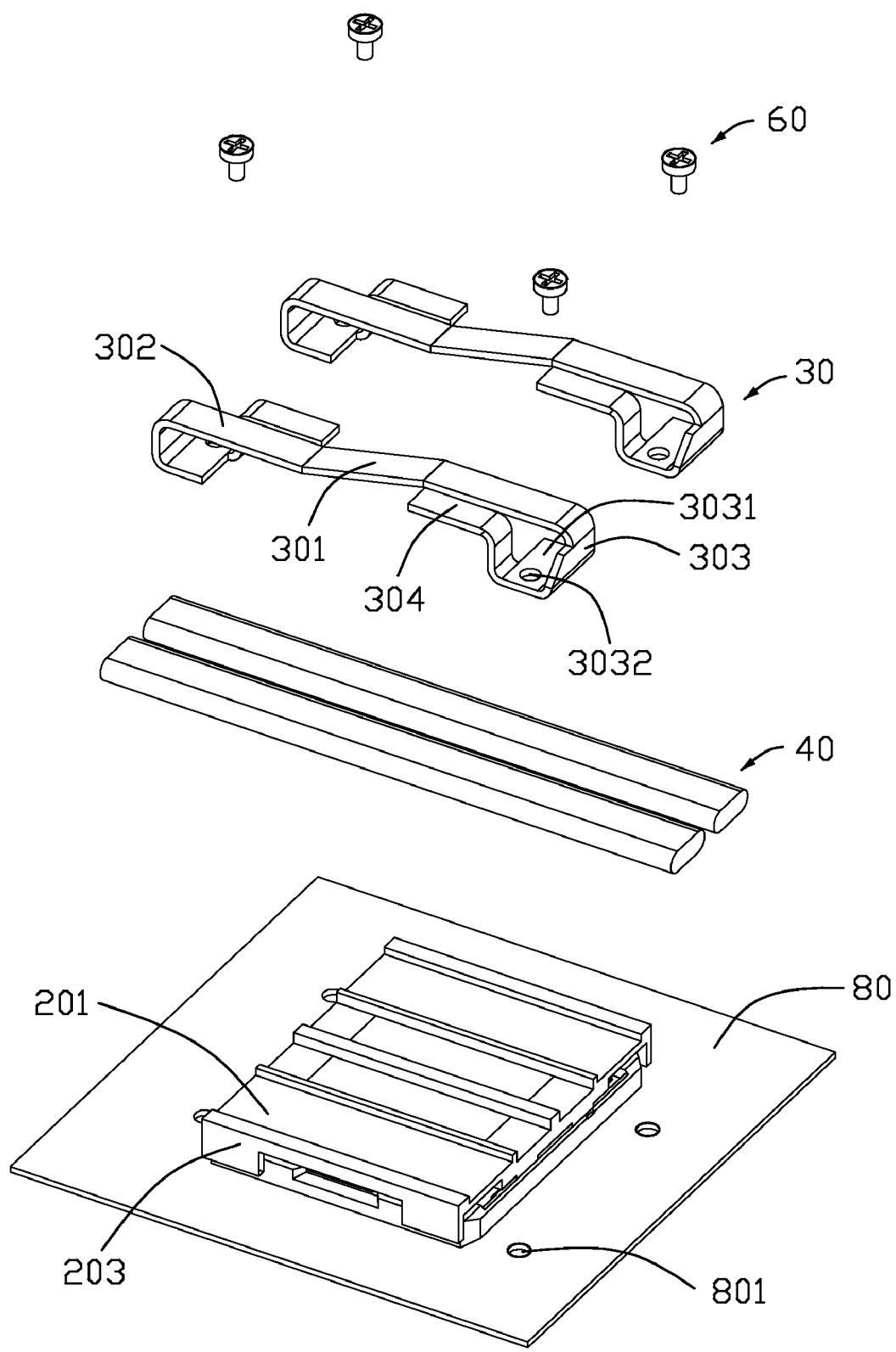
FIG. 6 is a partially assembled perspective view of the electrical connector assembly of FIG. 5.
Figure 7:
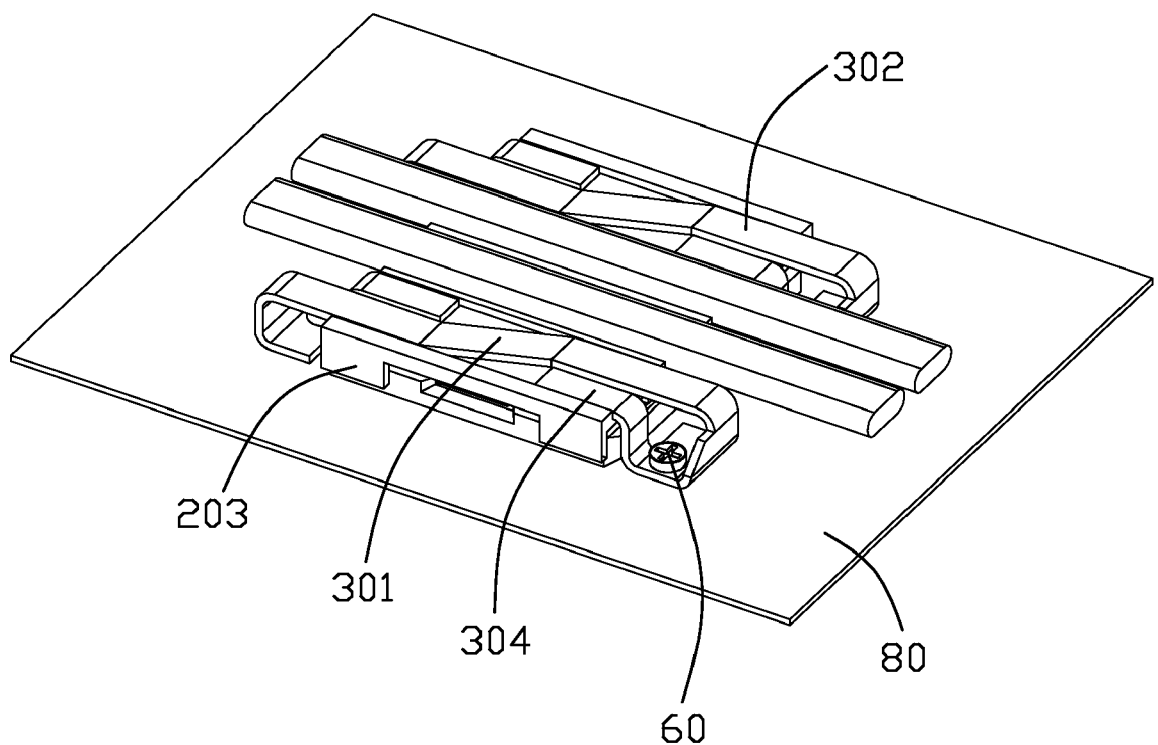
FIG. 7 is an assembled perspective view of the electrical connector assembly of FIG. 5.
Figure 8:
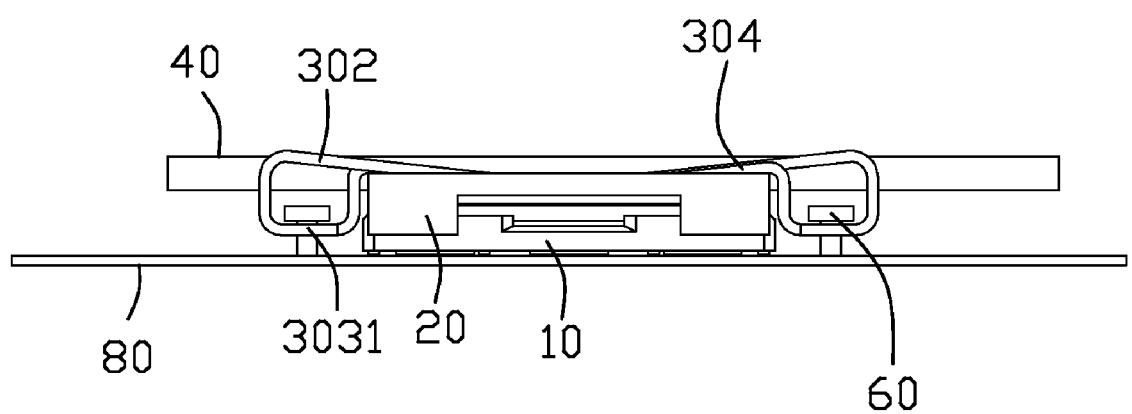
FIG. 8 is a side view of the electrical connector assembly showing a chip of the electrical connector assembly is not latched to the printed circuit board.
Figure 9:
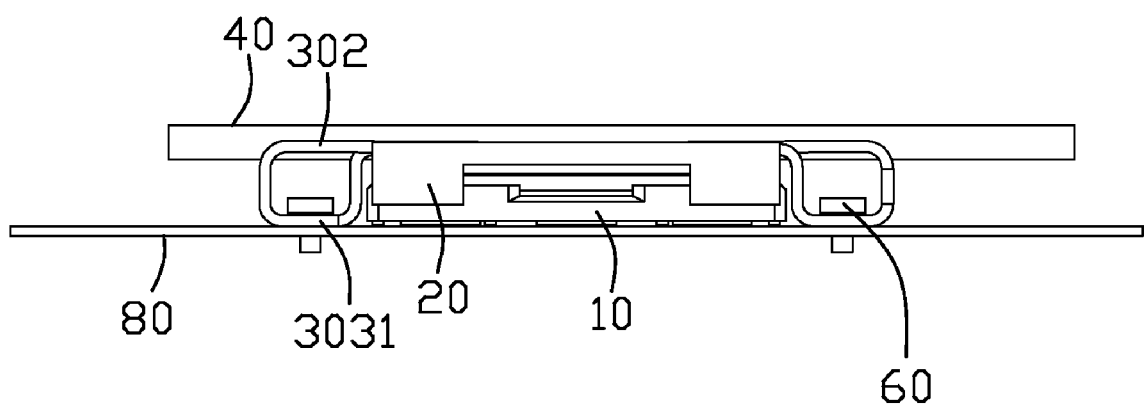
FIG. 9 is a side view of the electrical connector assembly showing the chip of the electrical connector assembly is latched to the printed circuit board by the screws.
Figure 10:
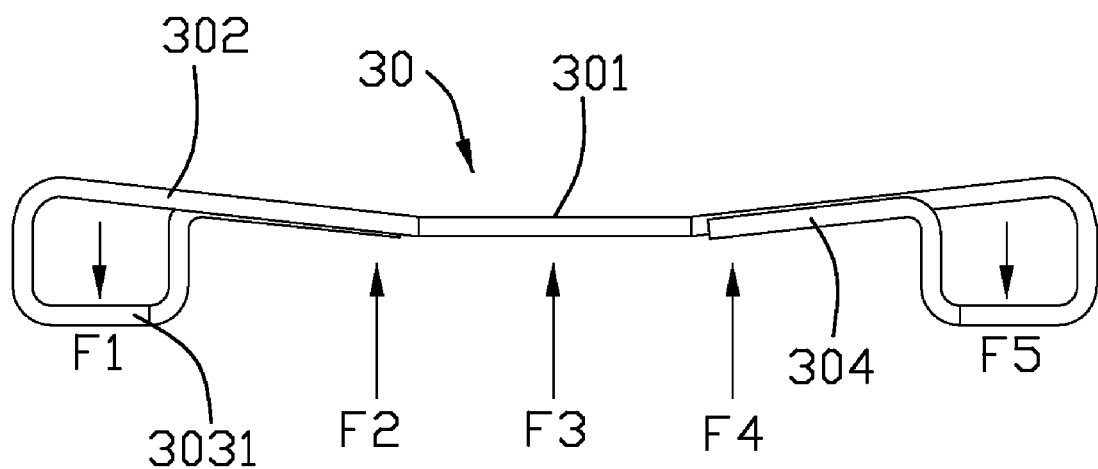
FIG. 10 is a side view of the chip of the electrical connector assembly.
Figure 11:
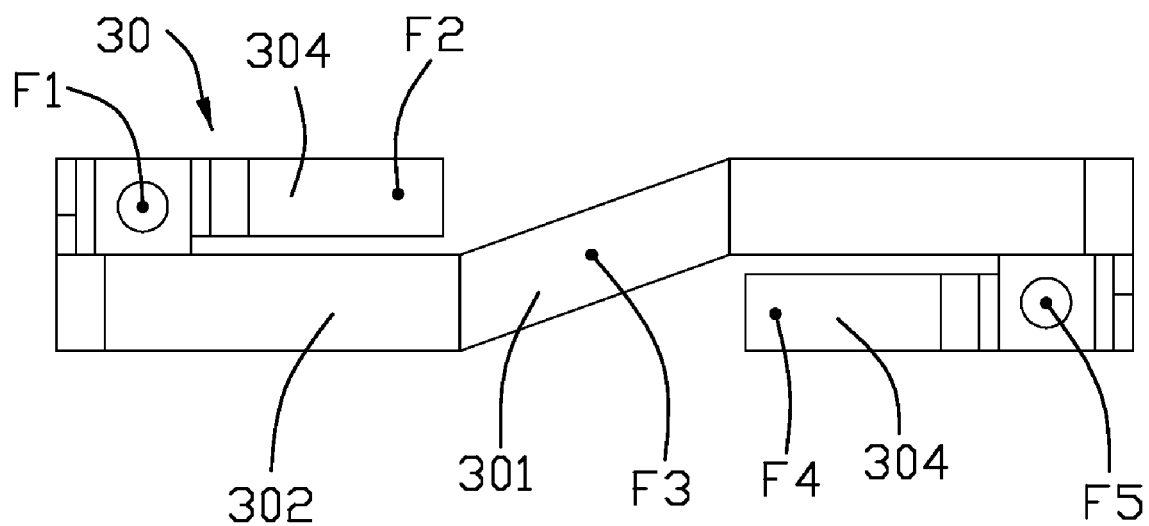
FIG. 11 is a top view of the chip of the electrical connector assembly.

Referring to FIG. 6, FIG. 10 and FIG. 11, the clip 30 is made of metallic material and is formed with substantially an S-shaped configuration. Each clip 30 comprises a base portion 301 extending in a horizontal direction, two spring portions 302 extending upwardly from two opposite ends of the base portion 301, a pair of mounting portions 303 extending downwardly from free ends of the spring portions 302, and a pair pressing portions 304 extending upwardly from free ends the mounting portions 303. The base portion 301 has a parallelogram shape, so the spring portions 302 are parallel to each other. The mounting portion 303 and the free end of the spring portion 302 are formed with substantially a U-shaped configuration. The mounting portion 303 comprises a mounting plate 3031 parallel to the base portion 301 and against to the printed circuit board 80. A mounting hole 3032 is defined on the mounting plate 3031 corresponding to the hole 801 on the printed circuit board 80 for receiving the connecting member 60 to secure the clip 30 to the printed circuit board 80. The pressing portion 304 firstly extends upwardly, and then extends downwardly. The pressing portion 304 can also extend horizontally and is coplanar with the base portion 301.

The clip 30 is an axially symmetrical configuration. In the present invention, each clip 30 has five points F1, F2, F3, F4, F5 bearing stress. The five points F1, F2, F3, F4, F5 are axially symmetrical to achieve a balanced force for the clip 30. The point F1 and the point F5 are symmetrical about the point F3, and the point F2 and the point F4 are symmetrical about the point F3.

Referencing to FIG. 6 to FIG. 9, showing an assembling process of electrical connector assembly, in assembling, firstly mount the insulative housing 10 to the printed circuit board 80 by soldering the contacts (not shown) to the printed circuit board 80; then put the electronic package 50 in the cavity 104 of the insulative housing 10; after that, assemble the heat plate 70 upon the electronic package 50 and assembled the supporting body 20 upon the heat plate 70; at last, mount the heat pipes 40 to the second receiving sections 205 of the supporting body 20 and mount the clips 30 to the first receiving sections 204 of the supporting body 20. The clips 30 are assembled to the printed circuit board 80 by the connecting members 60. When the electrical connector assembly is assembled, the base portion 301 presses a top surface of the first receiving sections 204, and the pressing portions 304 also press the top surface of the first receiving sections 204. The pressing portion 304 can a provide downward force when the screws 60 are secured tightly, thereby enough loading forces are provided to the electronic package 50, and the clip 30 will not generate deformations. The assembling process of the electrical connector assembly is not limited by above described.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. A metal clip to provide a loading force for pressing an electronic package to an insulative housing with contacts upon a heat plate mounted upon the electronic package and a printed circuit board, comprising:
   the clip comprising a pair of clips, each clip is formed with substantially an S-shaped configuration,
   the clip comprises a base portion extending in a horizontal direction and located in a horizontal surface or providing a loading force,
   two spring portions extending upwardly from two opposite longitudinal ends of the base portion,
   a pair of mounting portions extending downwardly from free ends of the spring portions, and
   a pair pressing portions extending upwardly from free ends of the mounting portions for providing another loading force; the base portion has a parallelogram shape, the spring arms are parallel to each other;
   the mounting portion comprises a mounting plate parallel to the base portion and a mounting hole defined on the mounting plate;
   the mounting portion and a free end of the spring portion are formed with a substantially U-shaped configuration.

2. The clip as claimed in claim 1, wherein the pressing portions are located on opposite transverse sides of the clip.

3. The clip as claimed in claim 1, wherein the clip has five points bearing stress.

4. The clip as claimed in claim 3, wherein the five points are axially symmetrical to achieve a balanced force for the clip.

5. The clip as claimed in claim 1, wherein the base portion and pressing portions press on a same surface.

6. The clip as claimed in claim 1, wherein the pressing portion extends downwardly.

7. The clip as claimed in claim 6, wherein the pressing portion extends horizontally and is coplanar with the base portion.

8. An electrical connector assembly electrically connecting an electronic package and a printed circuit board, comprising:
   an electrical connector mounted on the printed circuit board, the electronic package mounted upon the connector;
   a heat sink module mounted upon the electronic package; and a clip comprising a pair of clips, each metal clip is formed with substantially an S-shaped configuration and positioned upon the heat sink module, the metal clip comprises a base portion extending in a horizontal direction and downwardly pressing against the heat sink module, a pair of mounting portions mounted to the printed circuit board, and;

two spring portions extending upwardly from two opposite longitudinal ends of the base portion, a pair of mounting portions extending downwardly from free ends of the spring portion to be mounted to the printed circuit board, and a pair pressing portions extending upwardly from free ends the mounting portions to press against the heat sink module; the base portion has a parallelogram shape, the spring arms are parallel to each other;

the mounting portion comprises a mounting plate parallel to the base portion and a mounting hole defined in the mounting plate;

the mounting portion and the free end of the spring portion are formed with a substantially U-shaped configuration.

9. The electrical connector assembly as claimed in claim 8, wherein the pressing portions are located on opposite transverse sides of the clip.

10. The electrical connector assembly as claimed in claim 8, wherein the pressing portion and the base portion exert a loading forces to a coplanar surface.

11. The electrical connector assembly as claimed in claim 8, wherein the clip has five points bearing stress.

12. The electrical connector assembly as claimed in claim 8, wherein the heat sink module includes a heat plate mounted upon the electronic package, a metal supporting body mounted upon the heat plate, and a pair of heat pipes mounted upon the supporting body.

13. The electrical connector assembly as claimed in claim 12, wherein the heat pipes and the clip are mounted upon the supporting body.

14. An electrical connector assembly comprising:

a printed circuit board;

an electrical connector mounted upon the printed circuit board;

a CPU mounted upon the housing;

a supporting body positioned above the CPU;

a heat pipe confined and positioned upon the supporting body under condition that heat from the CPU is absorbed by said heat pipe;

a clip comprising a pair of clips, each piece clip fastening the supporting body to the printed circuit board and being essentially of a strip type member with plural bends thereof defining a S like configuration in a top view and including two opposite short pressing portion extending upwardly from two corresponding mounting sections which are located adjacent two opposite first and second ends of the housing along a front-to-back direction for securing the clip to the printed circuit board while being offset from each other in a transverse direction, two spring portions located adjacent and beside the two corresponding mounting sections and connected to each other via a base portion; wherein the short pressing portion located about the first end is essentially aligned, along the front-to-back direction, with the spring portion located about the second end, and the short pressing portion located about the second end is essentially aligned, along said front-to-back direction, with the spring portion located about the first end.

15. The electrical connector assembly as claimed in claim 14, wherein said heat pipe is thermally connected to the CPU via a heat sink module sandwiched between the heat pipe and the CPU.

16. The electrical connector assembly as claimed in claim 14, wherein said mounting sections are upwardly exposed to an exterior for easy screwing.

17. The electrical connector assembly as claimed in claim 14, wherein the clip has five points bearing stress.

* * * * *